United States Patent
Borremans

(10) Patent No.: US 12,283,602 B2
(45) Date of Patent: Apr. 22, 2025

(54) IMAGE SENSOR WITH IMPROVED COLOR ACCURACY

(71) Applicant: Spectricity, Mechelen (BE)

(72) Inventor: Jonathan Borremans, Lier (BE)

(73) Assignee: Spectricity, Mechelen (BE)

( * ) Notice: Subject to any disclaimer, the term of this patent is extended or adjusted under 35 U.S.C. 154(b) by 653 days.

(21) Appl. No.: 17/447,495

(22) Filed: Sep. 13, 2021

(65) Prior Publication Data
US 2022/0115428 A1 Apr. 14, 2022

Related U.S. Application Data

(60) Provisional application No. 63/089,981, filed on Oct. 9, 2020.

(51) Int. Cl.
*H01L 27/146* (2006.01)
*G02B 5/22* (2006.01)
*G02B 5/28* (2006.01)

(52) U.S. Cl.
CPC .......... *H01L 27/14621* (2013.01); *G02B 5/22* (2013.01); *G02B 5/28* (2013.01); *H01L 27/14625* (2013.01); *H01L 27/14643* (2013.01); *H01L 27/14685* (2013.01)

(58) Field of Classification Search
CPC ......... H01L 27/14621; H01L 27/14625; H01L 27/14643; H01L 27/14685; H01L 27/14627; H01L 27/14645; G02B 5/22; G02B 5/28; G02B 5/201
See application file for complete search history.

(56) References Cited

U.S. PATENT DOCUMENTS

2005/0105184 A1* 5/2005 Ma ................. G01N 21/3504
359/578
2015/0036046 A1 2/2015 Rudmann
(Continued)

OTHER PUBLICATIONS

German Patent and Trademark Office; Office Action; Application No. 10 2021 125 545.7; Jul. 22, 2024; 11 pgs.
(Continued)

*Primary Examiner* — Amar Movva
*Assistant Examiner* — Sandra Milena Rodriguez Villan
(74) *Attorney, Agent, or Firm* — GARLICK & MARKISON; Kelly H. Hale

(57) ABSTRACT

An imaging device includes a plurality of optical sensors on an integrated circuit and a plurality of sets of interference filters, where a set of interference filters of the plurality of sets of interference filters includes a plurality of interference filters that are arranged in a pattern with each interference filter of a set of filters being configured to pass light in a different wavelength range. A plurality of sets of absorption filters is included, with a set of absorption filters of the plurality of sets of absorption filters including a plurality of absorption filters arranged in a pattern and each absorption filter is associated with one or more interference filters to create an absorption filter and interference filter pair. Each absorption filter and interference filter pair is associated with one or more optical sensors and is configured to pass light in a narrower wavelength range than the absorption filter alone.

20 Claims, 13 Drawing Sheets

(56) References Cited

U.S. PATENT DOCUMENTS

| | | | |
|---|---|---|---|
| 2015/0144770 A1* | 5/2015 | Choi | H01L 27/14621 |
| | | | 250/208.1 |
| 2017/0059754 A1* | 3/2017 | Frey | G01J 3/2823 |
| 2020/0035733 A1* | 1/2020 | Huang | H01L 27/14685 |
| 2020/0284957 A1* | 9/2020 | Bellos | G01N 21/648 |

OTHER PUBLICATIONS

Kobylinskiy et al.; Substantial increase in detection efficiency for filter array-based spectral sensors; Appl. Opt.; Mar. 10, 2020; pp. 2443-2451; vol. 59, No. 8.

* cited by examiner

IMAGE SENSOR WITH IMPROVED COLOR ACCURACY

CROSS REFERENCE TO RELATED PATENTS

The present U.S. Utility Patent Application claims priority pursuant to 35 U.S.C. § 119(e) to U.S. Provisional Application No. 63/089,981, entitled "COLOR ACCURACY IMAGE SENSOR WITH REDUCED GHOSTING", filed Oct. 9, 2020, which is hereby incorporated herein by reference in its entirety and made part of the present U.S. Utility Patent Application for any and all purposes.

BACKGROUND OF THE INVENTION

Technical Field of the Invention

This invention relates generally to imaging and more particularly to digital imaging with improved color accuracy.

Most digital image sensors use color filters arranged on a grid of photosensors to enable the reproduction of a broad range of colors. A red, green and blue (RGB) color sensor, for example, uses filters for the three primary "channels" of red, green and blue additively to represent a full spectrum of light. The filters used in an RGB color sensor are typically organic "absorption" filters that can have undesirable filter characteristics. Filters with better filtering characteristics, such as interference filters, can be used, however the manufacturing complexity of interference filters is higher and unwanted reflection from light outside the filter passband can result in ghost images. Moreover, while providing more channels by incorporating additional filters can improve color accuracy, adding too many additional channels can deteriorate the resolution of an image sensor.

BRIEF DESCRIPTION OF THE SEVERAL VIEWS OF THE DRAWING(S)

Figure 2A:
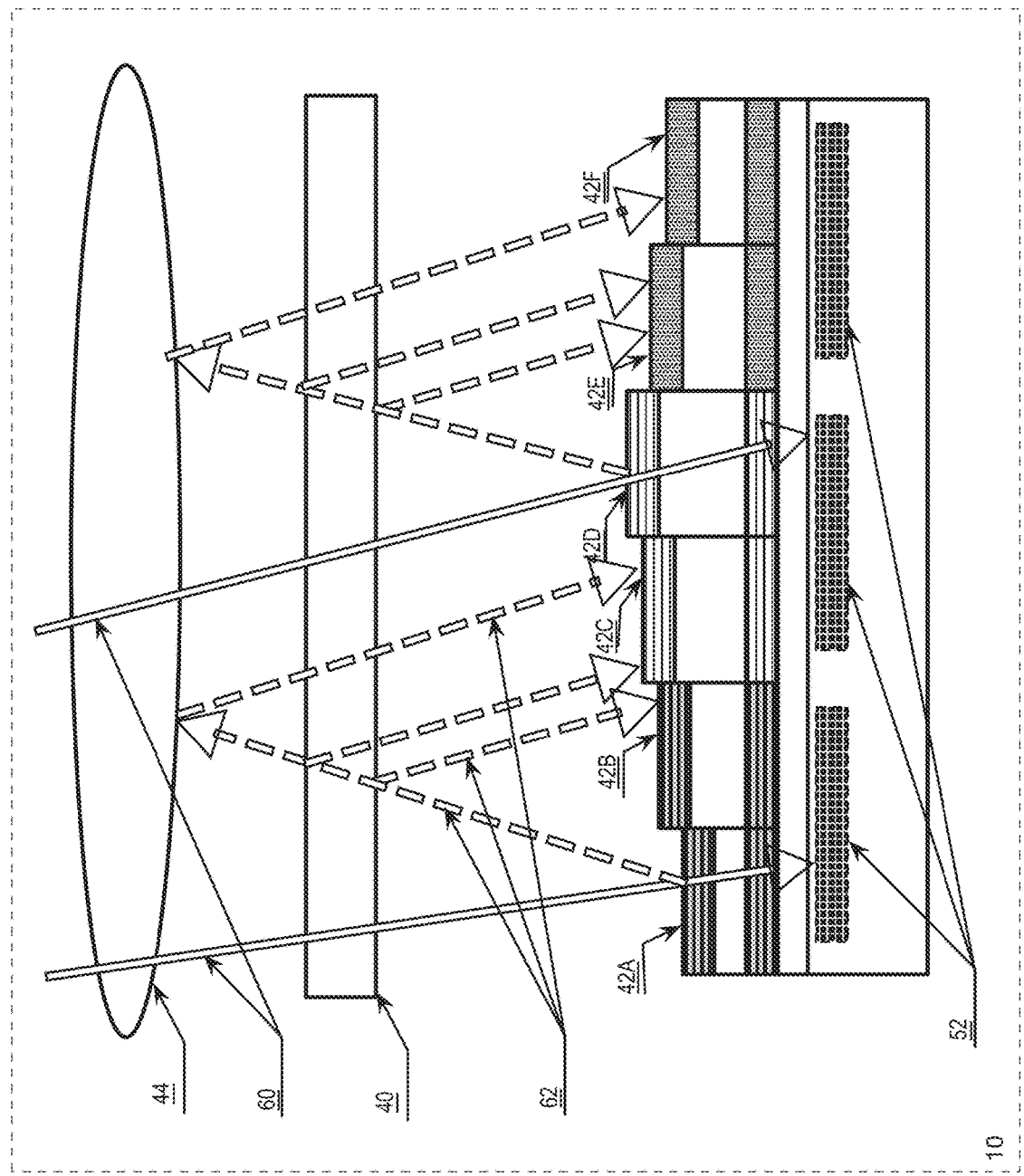
Figure 2B:
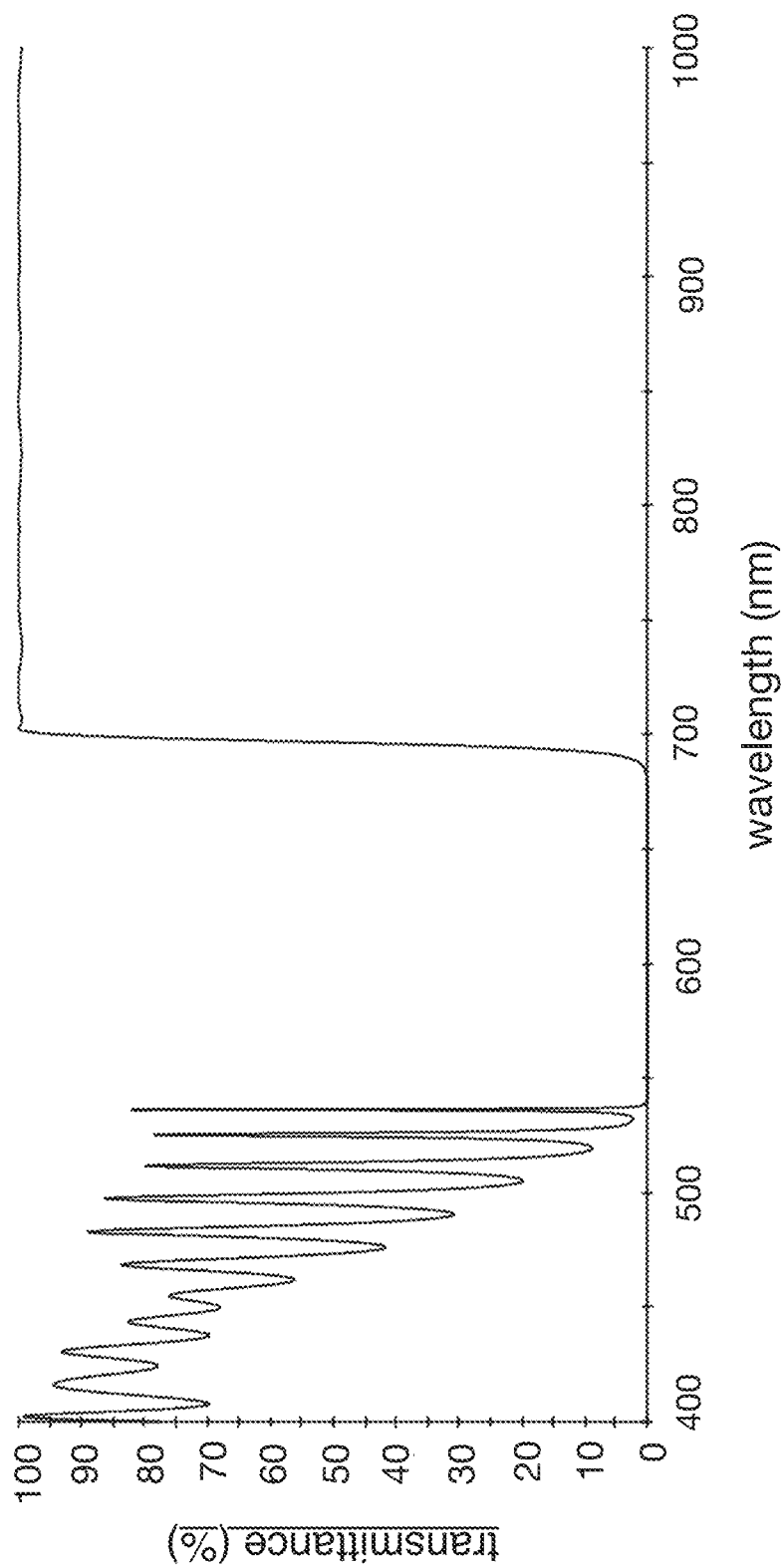
Figure 3B:
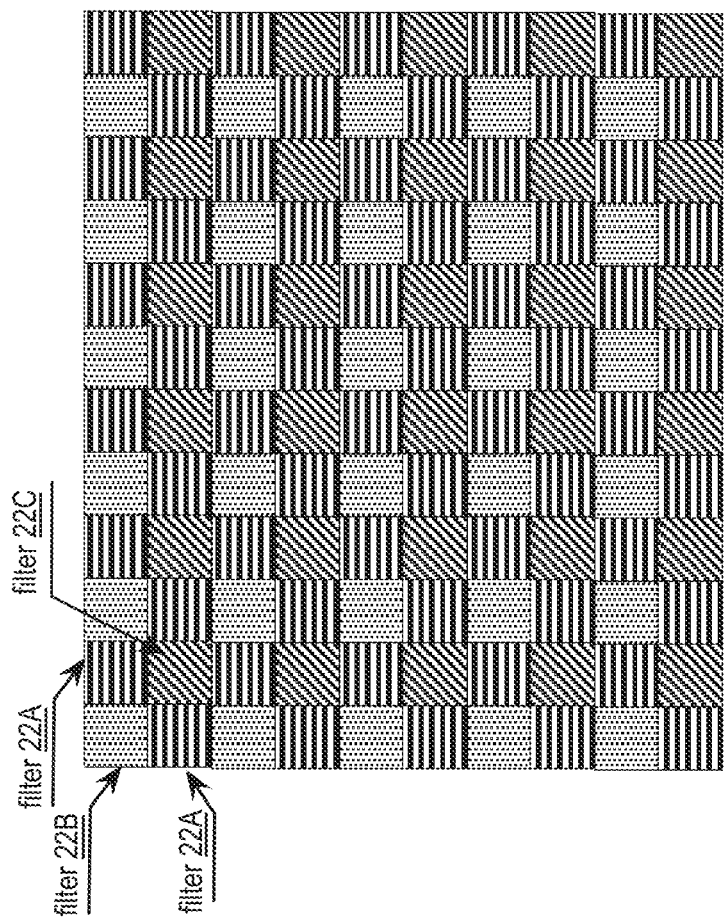
Figure 3A:
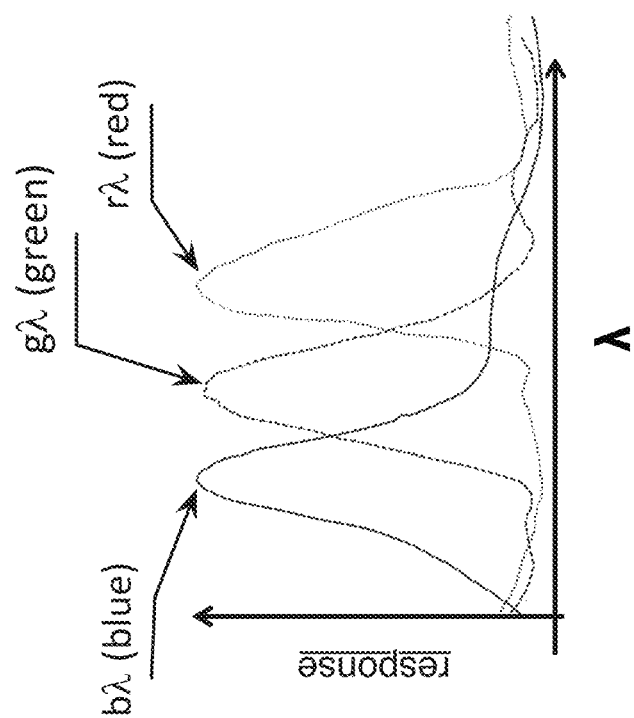
Figure 4A:
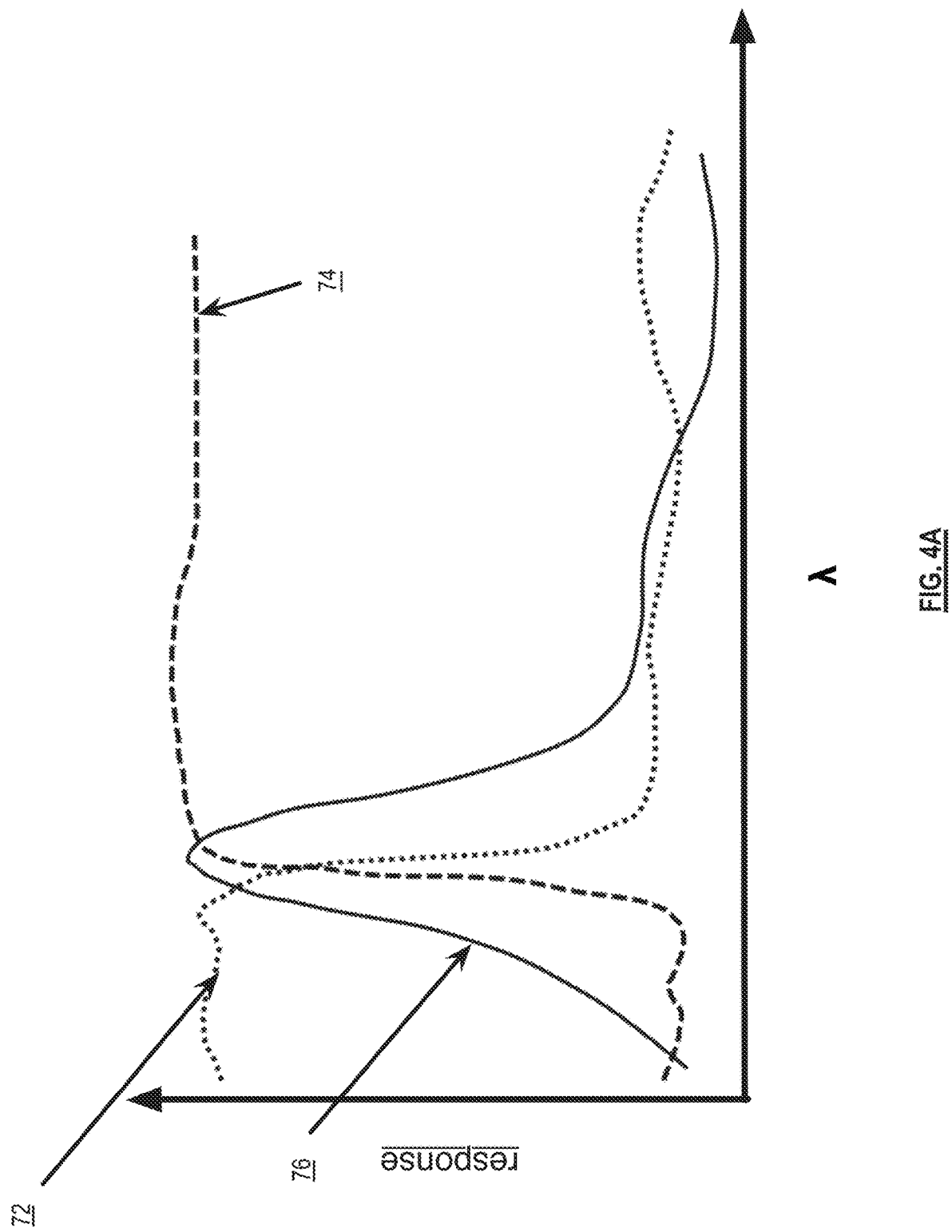
Figure 4B:
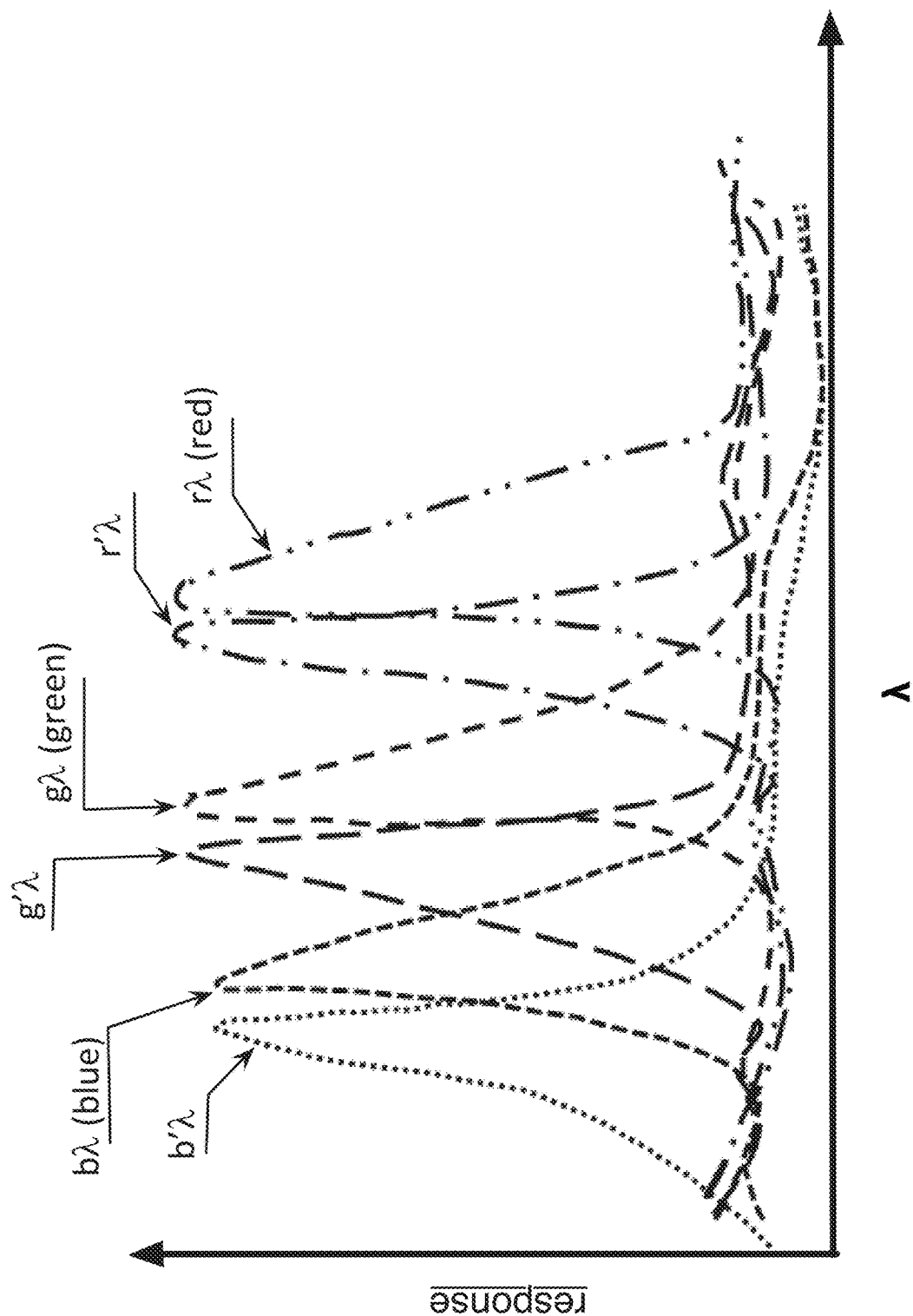
Figure 5:
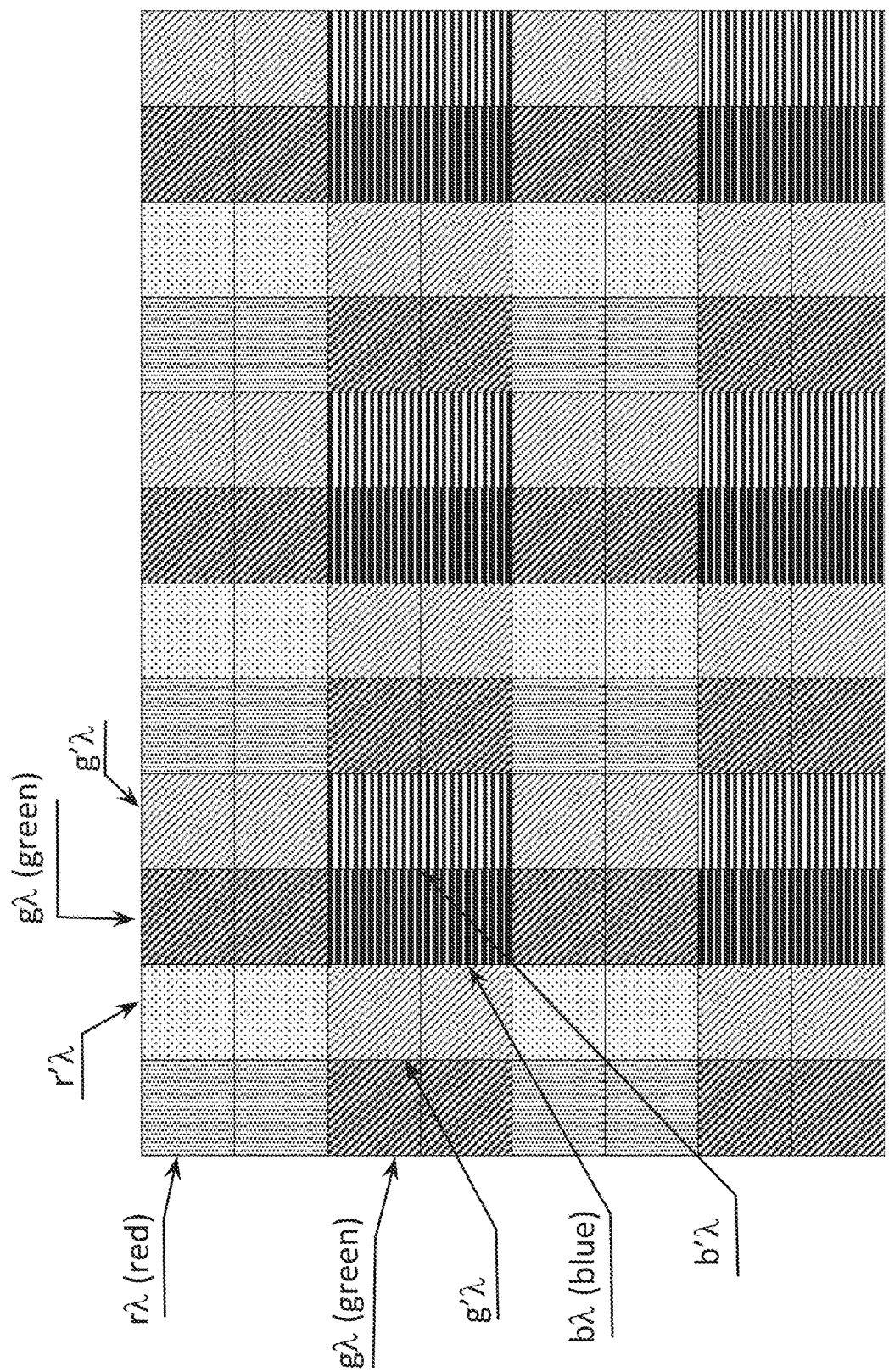
Figure 6:
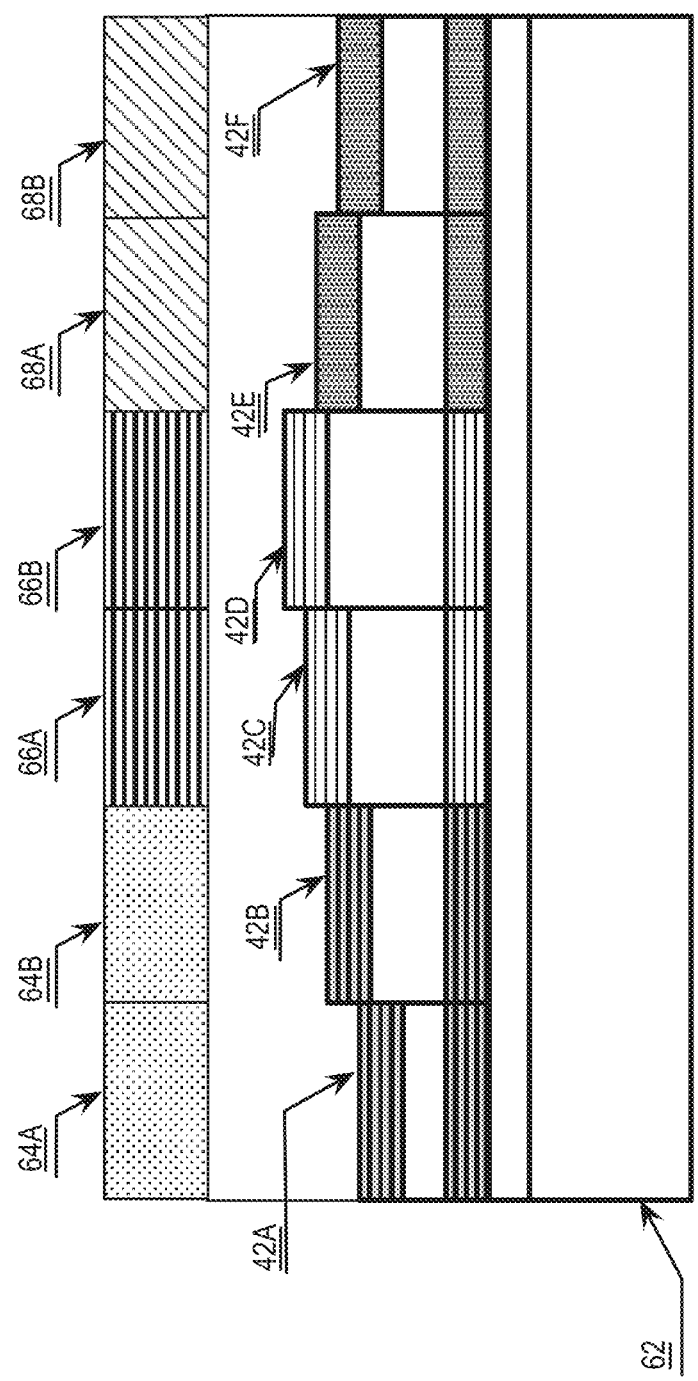
Figure 7:
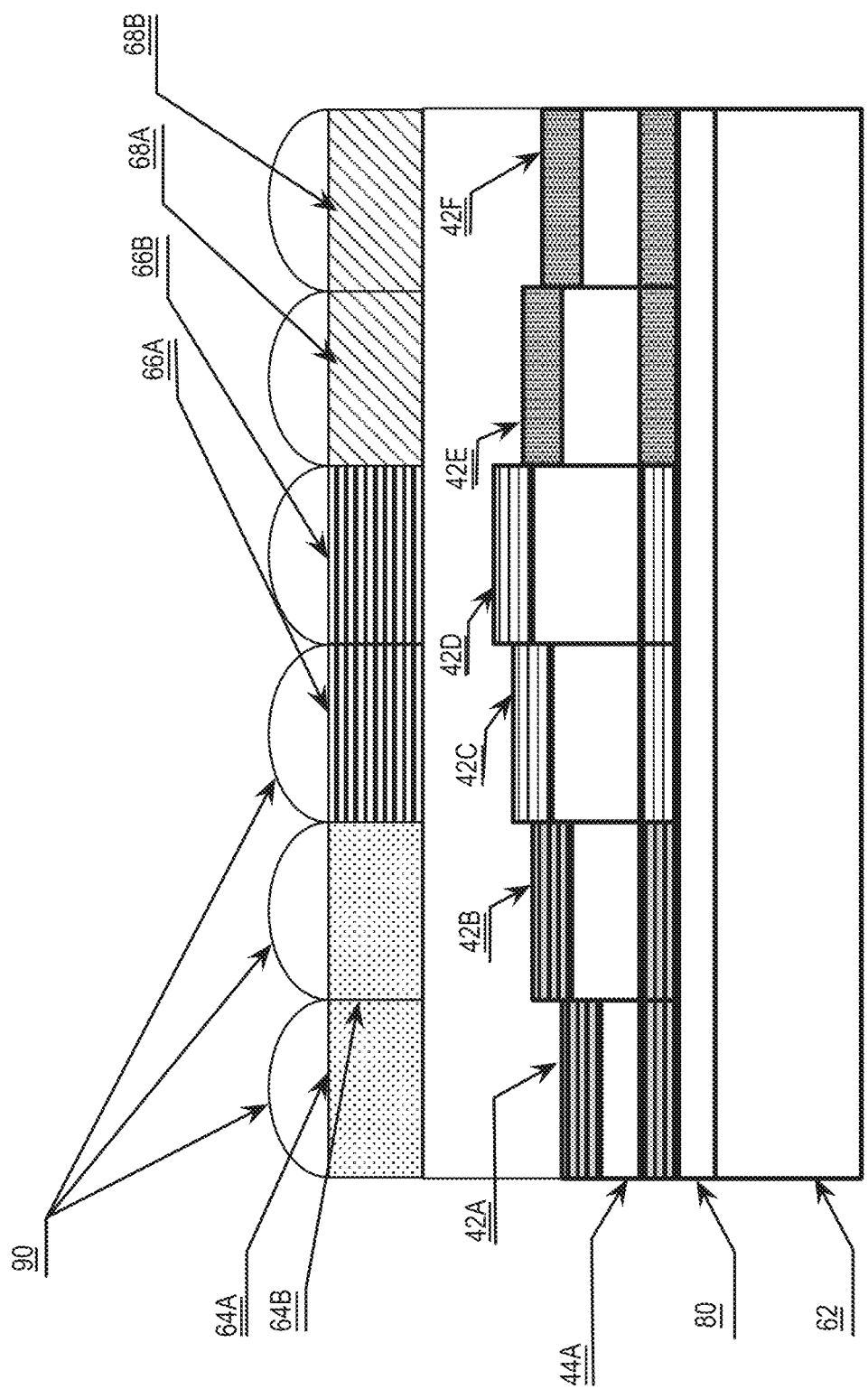
Figure 8:
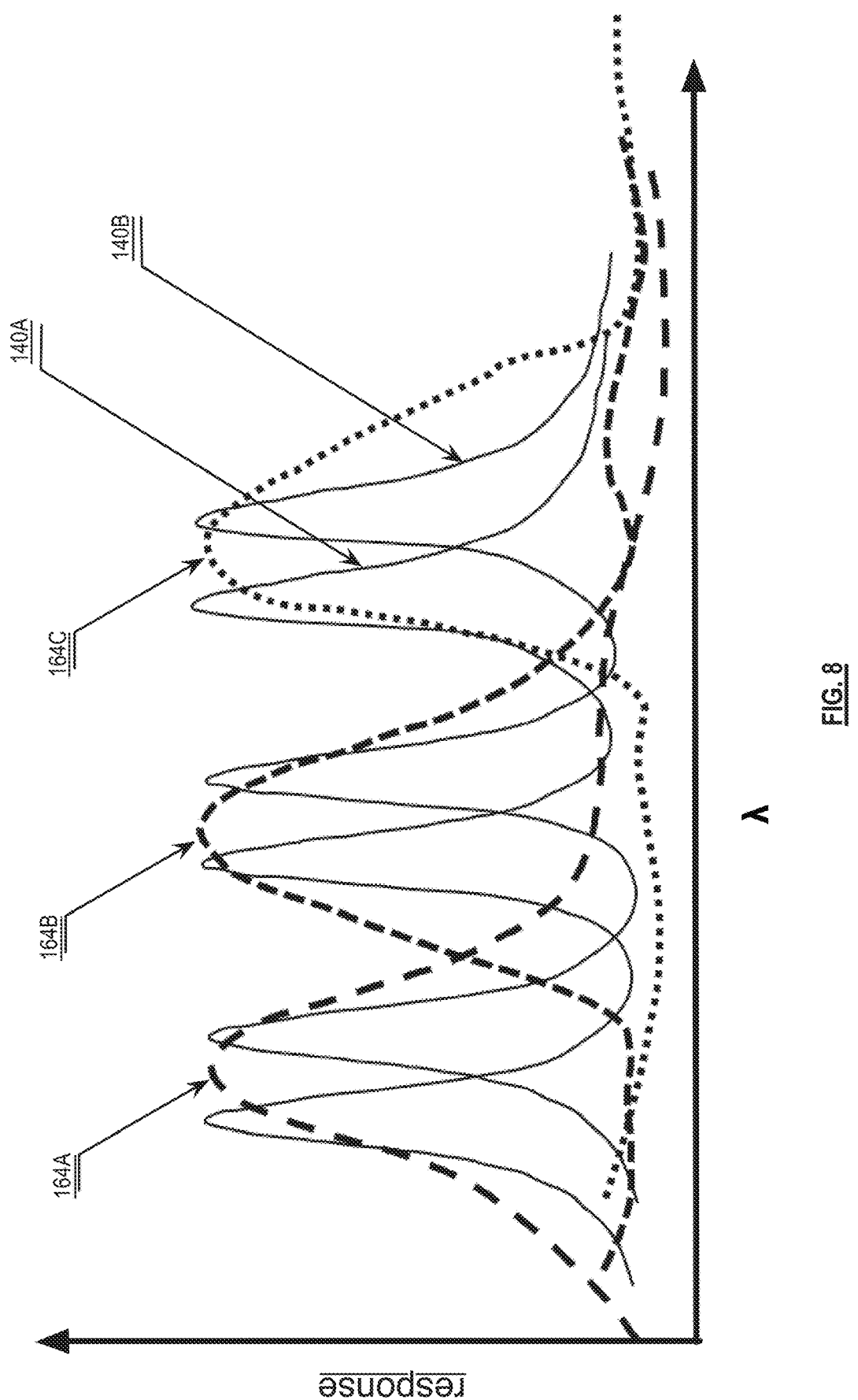

FIG. 2A provides a side view of an image sensor system illustrating characteristic reflectance from an interference filter;

FIG. 2B illustrates an example response of a long pass filter;

FIG. 3A provides example passband responses of RGB absorption filters;

FIG. 3B provides a top-down view of an array of RGGB filter mosaics in accordance with the present invention;

FIG. 4A provides the characteristic passband responses of select short pass and long pass interference filters overlaid on the response of a select absorption filter in accordance with the present invention;

FIG. 4B provides the combined passband responses of select short pass and long pass interference filters with matched RGB absorption filters in accordance with the present invention;

FIG. 5 provides a top-down view of an example 6-channel color filter pattern in accordance with the present invention;

FIG. 6 provides a side view of an image sensor with absorption filters overlaying interference filters in accordance with the present invention;

FIG. 7 provides a side view of an image sensor with micro-lenses overlaying absorption and interference filters in accordance with the present invention;

FIG. 8 provides the characteristic passband responses of a multi-band interference filter overlaid on each absorption filter of an RGB filter configuration.

Figure 9:
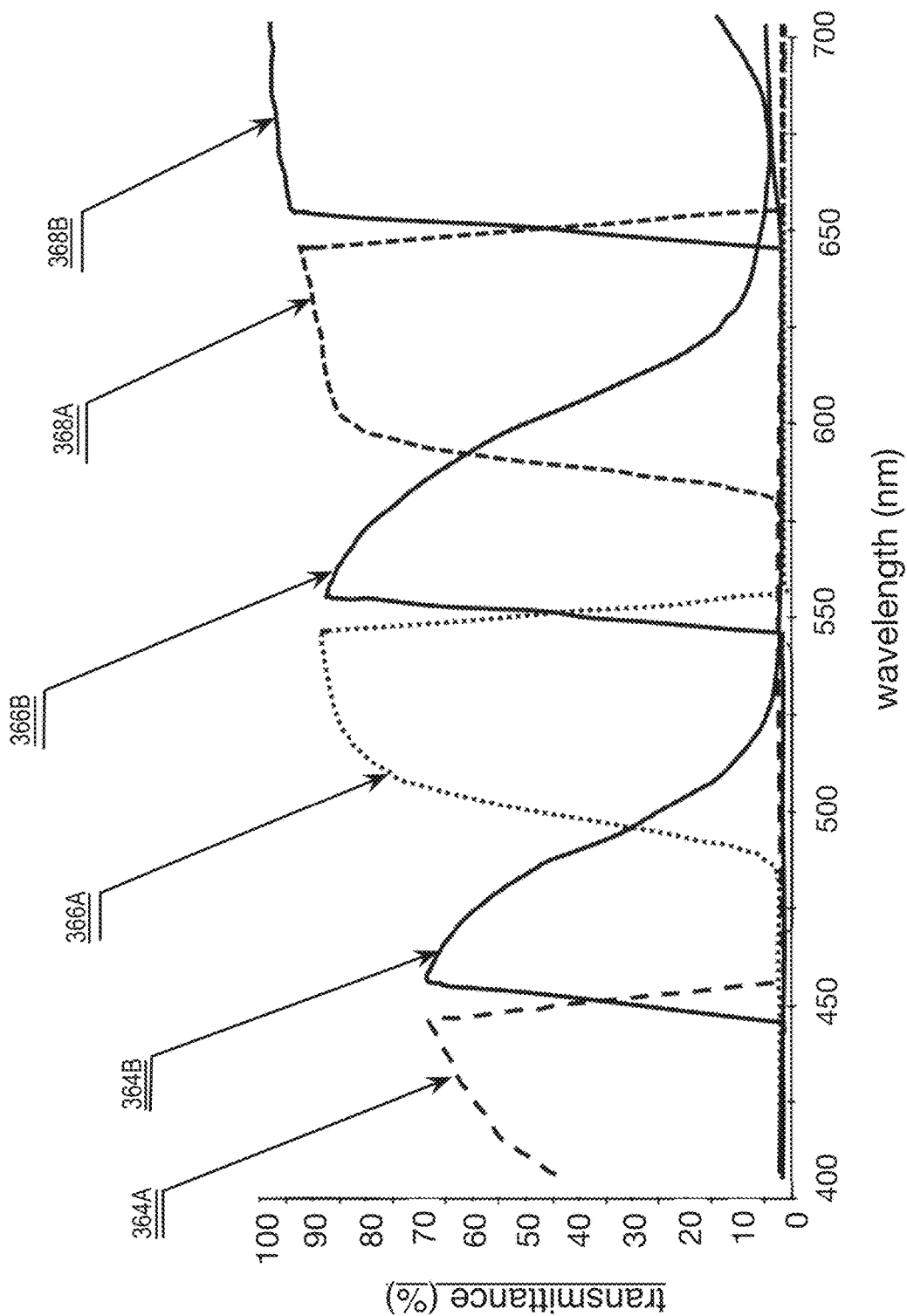
Figure 10:
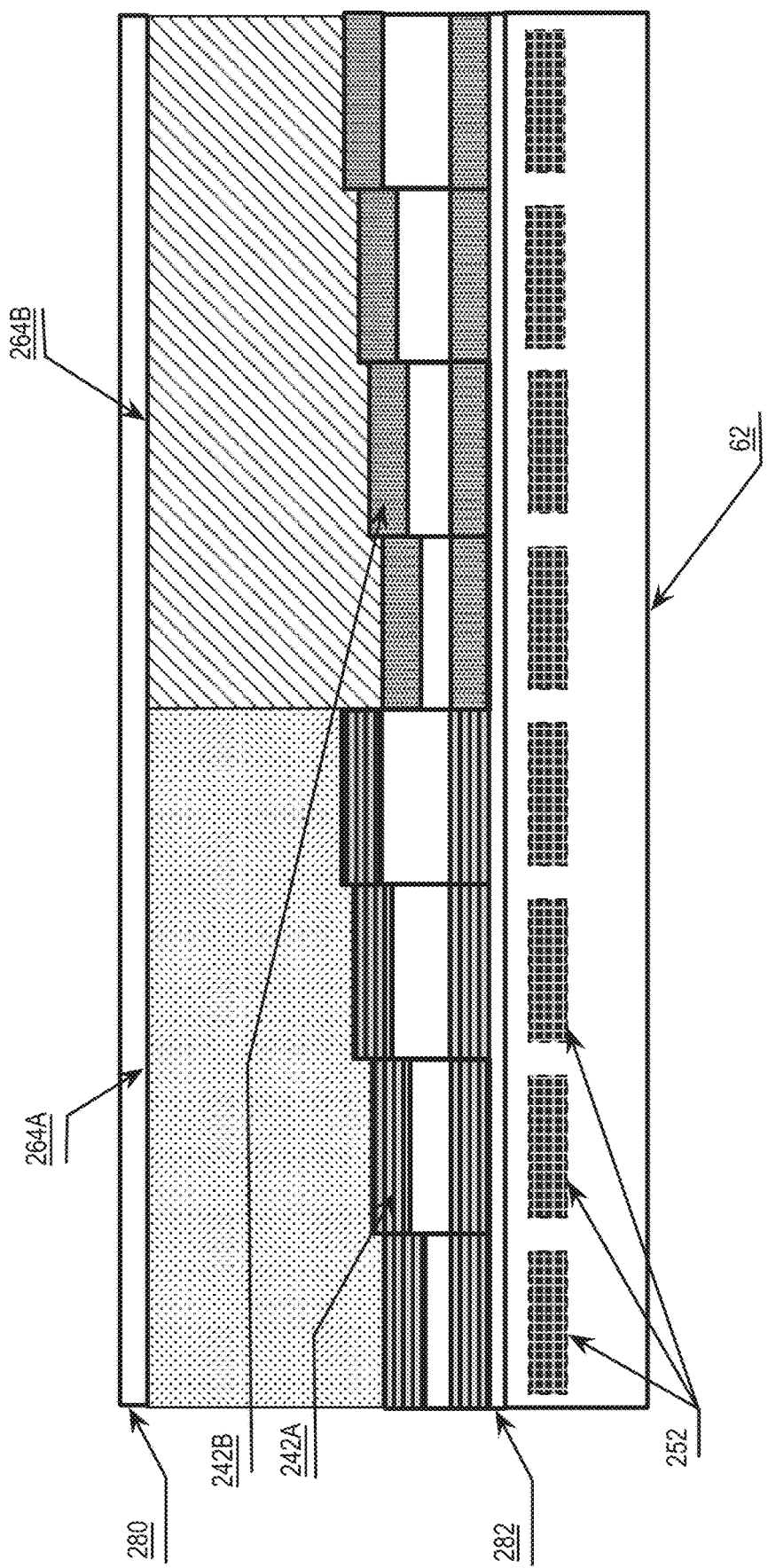
Figure 11:
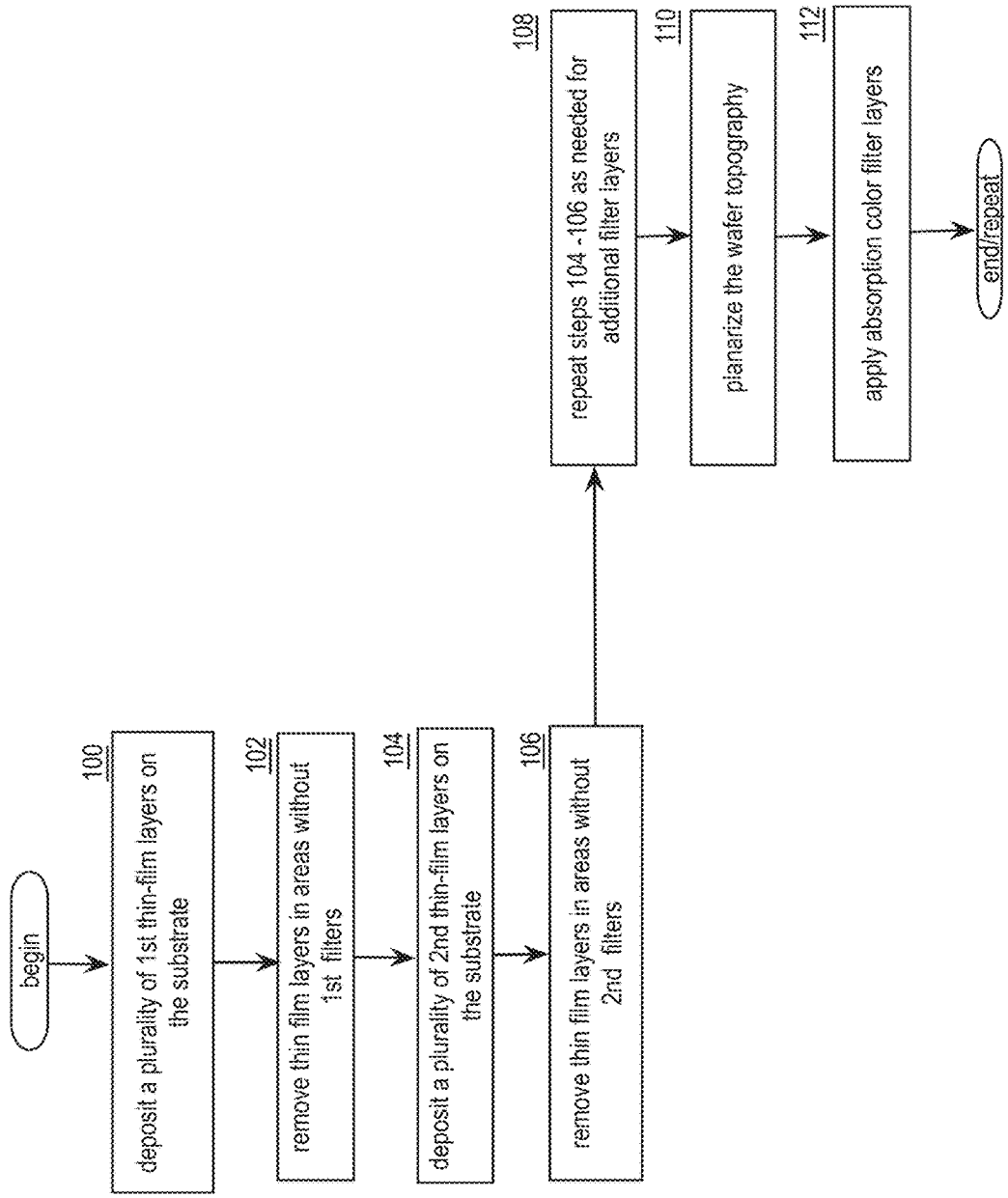

FIG. 9 provides an example spectral result from the combined passband responses of characteristic RGB absorption filters and interference filter pairs in accordance with the present invention;

FIG. 10 provides a side view of an image sensor with absorption filters overlaying interference filters in accordance with the present invention; and FIG. 11 is a flowchart illustrating an example method for manufacturing a sensor in accordance with the present invention.

DETAILED DESCRIPTION OF THE INVENTION

In various embodiments, digital image sensors combine absorption type color filters with interference-based filters to extend available color channels, providing additional color channels. In other embodiments, absorption type color filters are combined with interference-based filters to provide additional channels in the ultraviolet (UV), near-infrared (NIR) and infrared (IR) wavelengths. In some embodiments, interference-based filters are disposed with absorption filters in a stack over an array of photosensors. In further embodiments the passband of one or more interference filters is selected for use with each of a plurality of absorption filters to provide additional color bands for each pixel of an image sensor. In yet other example embodiments, a plurality of absorption filters are selected to reduce ghost artifacts in a sensor system.

Figure 1B:
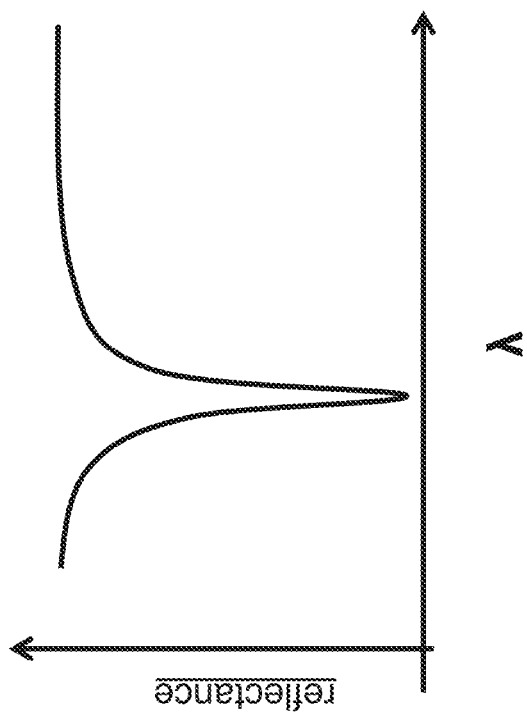
FIG. 1B illustrates an example reflectance response of an interference filter.
Figure 1A:
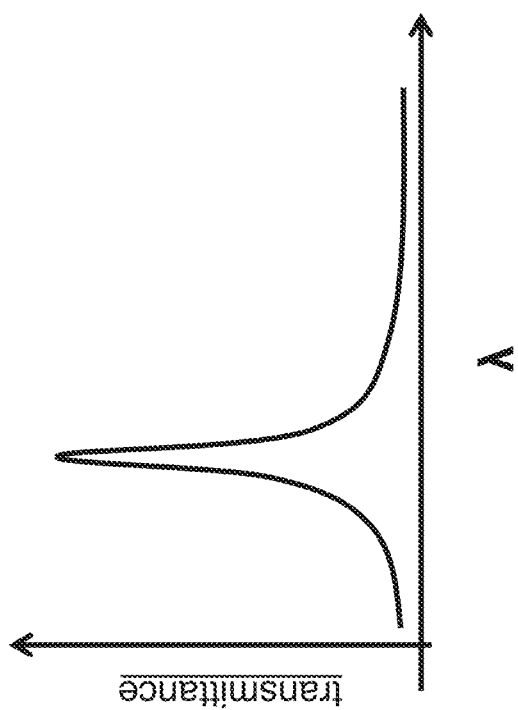
FIG. 1A illustrates an example passband response of an interference filter.

FIG. 1A illustrates an example passband response of an interference filter. In the example, the peak light transmittance of the interference filter is centered at a target wavelength within a passband where the passband is the range of wavelengths that can pass through the interference filter. In the example, light in the passband is passed through the interference filter and detected at the pixel. Light outside the range of wavelengths that can pass through the interference filter is reflected from the interference filter. FIG. 1B illustrates an example reflectance of the interference filter of FIG. 1B. In the example, the interference filter acts as a mirror for light outside the passband.

FIG. 2A provides a side view of an image sensor system 10 illustrating characteristic reflectance from an interference filter. In the example, incident light rays received at the sensor system pass through one or more lens elements 44, where it either passes through the passband of an interference filter, such as interference filters 42A-42F to a pixel element, such as pixel elements 52, and/or is reflected back as reflected light 62, where it can be reflected again by other elements of the image sensor system, such as cover glass 40, to pass through the passband of another interference filter. In an example, the sensor system 10 can include additional elements, such as a cover glass 40 for the image sensor, lens elements 44, packaging boundaries or bond wires (not shown), each of which can reflect light outside the interference filter passband that has been reflected by the interference filter. For example, an image sensor 10 can be implemented in a metal, plastic, glass, or ceramic casing (not shown), any of which can reflect back unwanted light. The multiple reflections or "bounces" of light in the image sensor system 10 can result in ghost images and/or blurring at the image sensor, because the reflected light will be offset from the incident light received at the interference filter. In an example, one or more rejection filters can be provided on the top surface of cover glass 40, or on the top surface of interference filters 42A-42F.

Typical absorption type color filters, such as the red, green and blue (RGB) filters, in an RGB (or RGGB) image sensor absorb light that is outside the passband of a given filter, thus there are few, if any, reflections. Accordingly, absorption type filters exhibit limited ghost images, however, absorption type filters are composed of materials, such as pigmented organic photoresists (such as cross-linkable acrylate copolymer with photo-initiators), that can exhibit nonideal filter characteristics. Interference filters, on the other hand, can provide useful filter characteristics, in addition to offering flexible design options for filter response when compared to absorption type filters, however, in addition to ghost images, interference filters are relatively complex to manufacture and can result in thick layers on a photosensor (pixel).

In addition to the red, green and blue (RGB) filters, in an RGB (or RGGB) based image sensor, other image sensor configurations use absorption type filters, each of which exhibit similar performance issues. Examples include: the cyan, magenta and yellow filters of a CMY based imager; the red, green, blue and white filters of an RGBW based imager; the cyan, yellow, green and magenta filters of a CYGM based imager and so forth.

FIG. 2B illustrates an example response of an interference-based long pass filter. Interference filter arrays designed to provide broad spectral response require additional manufacturing layers to suppress unwanted out-of-band-light. In the example response of FIG. 2B, the long pass response for light of wavelengths beyond about 700 nm also exhibits multiple harmonics and other unwanted transmission anomalies below about 500 nm, all of which require additional filter layers to remove. Accordingly, a given interference-based filter for an image sensor can comprise thick filter layers that exhibit unwanted crosstalk between filter elements when implemented in a pixelated pattern on a sensor. Additionally, the thick filter layers required by interference-based filters designed for broad spectral response can increase stress on substrates during manufacturing and can complicate the manufacture of small form factor pixels for high resolution imagers. For example, thick filter layers can introduce "wafer bow" during manufacture by adding stress to one side of the semiconductor wafer, leading to handling problems with tools and other issues.

FIG. 3A provides example passband responses for each of red, green and blue (RGB) filters absorption filters. RGB filters are typically implemented in a pattern of three or four filters repeated in an array over a grid or array of photosensor elements or pixel. When four filters are used in the pattern the green filter is typically repeated to produce an RGGB filter pattern. FIG. 3B provides a top-down view of a repeating RGGB filter pattern, where filters 22A are green filters and filters 22B and 22C are red filters and blue filters, respectively.

FIG. 4A provides the characteristic passband responses 72 and 74 of select short pass and long pass interference filters overlaid on the response 76 of a select absorption filter. In the example, a first interference filter is configured to pass wavelengths 72 at desired wavelengths below the wavelengths of the peak absorption of the select absorption filter response. A second interference filter is configured to pass wavelengths 74 at desired wavelengths above the wavelengths of the peak absorption of the select absorption filter response 76. In an example, the combination of the first interference filter and the second interference filter with a matched absorption filter results in two transmission peaks for the absorption filter, one just below the transmission peak for the absorption filter and one just above the transmission peak for the absorption filter.

In an example, a matched absorption filter can absorb out of band light wavelengths for each of the second and first interference filter, so that out of band light wavelengths do not reflect back to create ghost images. Additionally, the complexity of the filter stack for the first and second interference filters can be reduced, since unwanted transmission wavelengths no longer require compensating with additional filter layers. In an example, the resultant reduction in filter layers illustrated in FIG. 4A can result in thinner and less complex filter stacks, which in turn can result in less expensive filters with reduced optical crosstalk.

FIG. 4B provides the combined passband responses of select short pass long pass interference filters with matched RGB absorption filters. In an example, as explained with reference to FIG. 4A, each of the red, green and blue (RGB) absorption filters, when used in combination with two matched interference filters, results in two transmission peaks as illustrated. In an example, the two transmission peaks can result in three additional color channels for each filter mosaic, for a total of 6 color channels (b'λ, bλ (blue), g'λ, gλ (green), r'λ, and rλ (red). In other examples, different filter configurations can be used to add additional channels to RGB filters and to other filter configurations, including, but not limited to cyan, magenta and yellow (CMY) filters, red, green, blue and white (RGBW) filters, cyan, yellow, green and magenta (CYGM) filters, etc.

FIG. 5 provides a top-down view of an example 6-channel color filter pattern. In the example, each of the red, green and blue filters of a typical RGGB filter pattern includes an additional filter response. In the example shown, the filter pattern includes filters b'λ, bλ (blue), g'λ, gλ, (green), r'λ, and rλ (red). Other examples (not shown) include absorption filters matched with interference filters to provide additional channels in ultraviolet (UV), visible (VIS) near-infrared (NIR) and infrared (IR) wavelengths. In an example, an absorption filter, such as an organic filter can be matched with select interference filters to provide additional channels in the UV, VIS, NIR and IR wavelength bands. In another example, the interference filters can be Fabry-Pérot filters and/or plasmonic interference filters. In yet another example, the absorption based-filters and/or interference filters of FIGS. 4B and 5 can comprise one or more of short-pass, long-pass, band-pass or band-stop filters.

In a specific example of implementation and operation, the output of an image sensor, such as image sensor 10 from FIG. 2A, can be processed to demosaic an image produced from the application of a particular filter pattern, such as the example 6-channel filter pattern described in FIG. 5. In an example, a demosaicing process can be used to extract the spectral bandpass response from a set of filters. The demosaicing process can be enabled using one or more processors, where the processors use an algorithm or digital image process to reconstruct a bandpass response from optical sensors associated with individual filters of a set of filters. In an example where two groups of optical sensors are interspersed a demosaicing process can be used to retrieve spectral information from a subset of filters in an interspersed group or array.

In a specific related example, an optimized configuration of color filters can be used to improve the demosaicing algorithm. In a specific example, a multi-channel filter pattern can be configured so that each of the channels is separated as much as possible from the channels with the closest wavelengths, such that interference from an adjacent filter will be less likely to propagate to the other channels in the filter pattern.

In another example, all or a portion of the output of an example image sensor, such as image sensor 10 from FIG. 2A, can be processed to spectrally correct and/or provide white balance correction for an image produced by the image sensor and/or for discrete portions of an image. In yet another example, an optimized configuration of the color filters can be used to enhance the spectral correction of a particular algorithm used for white balancing.

FIG. 6 provides a side view of an image sensor, such as image sensor 10 from FIG. 2A, with absorption filters 64A, 64B, 66A, 66B, 68A and 68B overlaying interference filters 42A-42F. In an example, each absorption filter 64A, 64B, 66A, 66B, 68A or 68B is matched with an interference filter, in a filter pair. In the example, absorption filters 64A and 64B are configured to pass wavelengths with the same center wavelength such as, for example, the red absorption filters in a typical red, green, green and blue (RGGB) filter pattern. In an example, each of absorption filters 64A, 64B, 66A, 66B, 68A and 68B are matched with a different interference filter, with the filter response of the combined filter pairs producing two color channels for sensing by sensor 62. In an example, although illustrated as separate filters, absorption filters 64A and 64B can be manufactured as a single filter. In another example, a single interference filter can be manufactured under two different absorption filters 64A and 64B to pass a different portion of an interference band.

FIG. 7 provides a side view of an image sensor using the arrangement of FIGS. 4-6 with micro-lenses overlaying absorption and interference filters. In an example, a micro-lens 90 can be included over one or more absorption filters 64A, 64B, 66A, 66B, 68A and 68B and interference filter pairs with interference filters 42A-42F. In another example (not shown), a light baffle or shroud is provided either in place of or in addition to the micro-lens 90 of FIG. 7 to prevent stray light from affecting sensor performance. Example light shrouds or baffles comprise one or more of a metal, a pseudo metal, an opaque deposited material and/or any other material capable of absorbing light. In other examples, light pipes and/or deep trench isolation (DTI) can be used to channel light and prevent crosstalk light from degrading system performance. In yet another example, the absorption filters and interference filters of FIGS. 4-7 can be implemented in a back-illuminated sensor, also known as backside illumination (BSI or BI) sensor. BSI based imagers can use an arrangement of imaging elements on the reverse side of the integrated circuit comprising an image sensor. In yet another example, planarization layers, such as, for example, organic spin coated materials, oxide deposited layers and other planarization layers can be used to compensate for non-planarity of filter layers.

In an example of implementation and operation, an imaging device comprises a plurality of optical sensors on an integrated circuit, with a plurality of sets of interference filters disposed atop the optical sensors. In an example, the sets of interference filters are separated by an etch-stop layer from the plurality of optical sensors. In an alternate example, the sets of interference filters are additionally separated from the plurality of optical sensors by an airgap or a substantially transparent material. In an example this material comprises one or more organic materials. In another example, this material can be optimized to limit reflection and/or can comprise an alloy gradient or a stack of layers. In an example, a set of interference filters of a plurality of sets of interference filters includes a plurality of interference filters that are arranged in a pattern, with each interference filter configured to pass light in a different wavelength range. In a specific example, each interference filter is one or more of a short-pass, long-pass, band-pass or band-stop filter and each interference filter is configured to pass light in at least one of the ultraviolet spectral range, visible light spectral range, near infrared spectral range or infrared spectral range. In another specific example, one or more interference filters of the plurality of sets of interference filters comprises a Fabry-Pérot filter. In yet another specific example, one or more interference filters of the plurality of sets of interference filters comprises a plasmonic interference filter. In another specific example, at least some absorption filters of the plurality of sets of absorption filters are configured to pass infrared light or are configured to cutoff infrared light. Example filters include IR-Pass filters, and IR-Cut filters, respectively. In yet another specific example, an interference filter or set of interference filters can be included at only some locations on the image sensor array, with some pixels being associated with one or more absorption filters without underlying interference filters.

In an example, a plurality of sets of absorption filters are disposed atop the plurality of sets of interference filters, where each absorption filter is one or more of a short-pass, long-pass, band-pass or band-stop filter and each absorption filter is configured to pass light in at least one of the ultraviolet, visible light spectral range, near infrared spectral range or infrared spectral range. The absorption filters can comprise organic filters and/or plasmonic filters. In an example, the sets of absorption filters are separated by an etch-stop layer from the plurality of interference filters. In an alternate example, the sets of absorption filters are additionally separated from the plurality of interference layers by an airgap or a substantially transparent material. In an example, the transparent material can also be optimized to limit reflection, and/or can comprise an alloy gradient and/or a stack of layers.

In a specific example, the set of absorption filters of the plurality of sets of absorption filters includes absorption filters that are arranged in a pattern, where each absorption filter of the set of absorption filters is associated with one or more interference filters to provide an absorption filter and interference filter pair. In a specific example, the interference filter in at least one absorption filter and interference filter pair comprises a plurality of interference filters. In an example, the response of each absorption filter and interference filter pair is configured to pass light in a narrower wavelength range than the absorption filter would pass alone. In another example, each absorption filter and interference filter pair can be optically aligned with at least one optical sensor of the plurality of optical sensors. In an example, micro-lenses assemblies can include absorption filter and interference filter pairs where each of the absorption filter and the interference filter can be displaced from the individual optical sensors in the plane of the image sensor, so that light passing through the micro-lens associated with a specific chief ray will substantially pass through an associated absorption filter and interference filter, respectively. In an example, the micro-lens 90 can reduce crosstalk when matched with an absorption filter and interference filter pair.

In yet another example, the imaging device includes a plurality of micro-lenses disposed atop a plurality of sets of absorption filters, with each micro-lens associated with at least one absorption filter. In another example, one or more of light baffles, light pipes or deep trench isolation is used to reduce stray light from affecting the light in one or more absorption and interference pairs.

In an example of operation and implementation, additional color channels, as described with reference to FIGS. 4A, 4B, 5 and 6, can be used to provide improved white balancing in addition to improved color accuracy when compared to image sensors and image sensor systems that use absorption-type filters alone. In a specific related example, a first image sensor with increased spectral resolution can be configured to co-operate in an imaging system with a second image sensor that has been configured to image the same scene. In the example, the first image sensor provides increased color accuracy information to correct the image of the second image sensor. In a related example, the second image sensor can have increased spatial resolution while having reduced spectral information as compared to the first image sensor.

In a related example of operation and implementation an image sensor can be configured to include some absorption filters that are not paired with interference filters, along with other absorption filters that are paired with interference filters. In a specific example, a green absorption filter G of an image sensor can be configured without an underlying paired interference filter, while another absorption filter $G_a$ is be configured with an underlying paired interference filter. In the example, the missing spectral filter response can then be computed as $G_b=G-G_a$. An image sensor implementing paired and unpaired interference filters, such as those illustrated in FIGS. 4A, 4B, 5 and 6 can provide beneficial performance in low-light conditions where, for example, the filter G from the relationship $G_b=G-G_a$ will provide a broader optical bandwidth, and therefore can be more sensitive in low-light conditions that includes one or more additional color channels. In specific related example of implementation or operation, filters without underlying absorption filters can be configured for use in low-light conditions. In another specific related example, interference filters sparsely distributed across a sensor array can be used to provide color accuracy improvement, while limiting the overall impact that additional color channels can have on light sensitivity. In a related example of operation and implementation, an image sensor can be configured to include some interference filters that are not paired with absorptive filters, along with other interference filters that are paired with absorptive filters.

In another example of operation and implementation, one or more cavity layers in any of interference filters 42A-42F can comprise a material or composite of materials adapted to absorb at least some undesired wavelengths while passing desired wavelengths. In an example, the materials can comprise porous optical materials with a refractive index closer to 1.0 (low-n materials) and/or optical materials with a higher refractive index. In an example, the cavity material can be a semiconductor having a refractive index of 2.5~3.5 that will exhibit light propagation different from a cavity comprising air (n=1.0). In a specific example, the cavity can comprise an amorphous or semi-amorphous direct bandgap III-V material, where the absorption characteristics of the cavity material can be altered by altering the III-V material alloy ratios, or by substituting different alloys. In an example, the cavity material can be adapted to absorb photons with energy higher than bandgap and pass photons that have lower energy.

FIG. 8 provides the characteristic passband responses of a multi-band interference filter overlaid on each absorption filter of an RGB filter configuration. In an example of operation and implementation, interference filters are configured as a multi-band filters, such that when the interference filters are combined with an absorption filter, one of the spectral bands of the multi-band filter can be selected to define a smaller portion of the absorption filter. In an example, fewer interference type filters will be required during manufacture of the image sensor, thereby reducing complexity. Referring to FIG. 8, a first interference filter is configured to provide wavelength response 140A in a narrow band below the wavelengths of the peak absorption for each of the blue, green and red absorption filter responses. In an example of implementation, a second interference filter is configured to provide wavelength response 140B in a narrow band above the wavelengths of the peak absorption for each of absorption filters associated with response peaks 164A (blue), 164B (green) and 164C (red). In an example, the combination of the first and second multi-band interference filters with matched absorption filters results in two transmission peaks for each absorption filter, one just below the transmission peak for the absorption filter and one just above the transmission peak for the absorption filter. In an example of implementation, complementary interference filters can be configured to pass wavelengths in a narrow band for each of blue and green filters in a similar manner. In a related example, FIG. 8 illustrates an embodiment where one or more absorption filters is adapted to select for a targeted harmonic of a select interference filter. In yet another example, an interference filter or set of interference filters can be included at only some locations on the image sensor array, such that the image sensor array will include both unmodified RGB or RGGB filter structures, and modified RGB or RGGB filter structures, where the response from the unmodified and modified RGB or RGGB filter structures can be used to calculate compensated RGB values.

In an example, a matched absorption filter, such as the absorption filters associated with response peaks 164A, 164B and 164C, respectively, can absorb out of band light wavelengths for each of the first and second interference filters discussed above, such that out of band light wavelengths do not reflect back as ghost images. In an example, filter stack complexity for the first and second interference filters can be reduced, since unwanted transmission wavelengths are substantially attenuated and therefore no longer need to be compensated for by adding filter layers. In an additional example, a resultant reduction in filter layers can enable thinner and/or less complex filter stacks, which in turn can result in less costly filters with reduced crosstalk.

FIG. 9 provides an example spectral result from the combined passband responses of characteristic RGB absorption filters and interference filter pairs. In the example, a 6 filter pattern results in a spectral result that doubles the number of color channels. In the specific example of FIG. 9, an absorption filter and interference filter pair combine to provide two color channel responses 364A and 364B associated with a blue channel, while another absorption filter and interference filter pair combine to provide two color channel responses 366A and 366B associated with a green channel and a third absorption filter and interference filter pair combine to provide two color channel responses 366A and 366B associated with a green channel.

In an example of implementation, an RGB-IR sensor can be formed by utilizing an interference infrared (IR) cut filter paired to R, G and B absorptive-type filters on an optical sensor array. In an alternative example, an optical sensor is not covered with the IR cut filter and configured to pass IR light. In another example, the optical sensor is overlayed with an absorptive IR pass filter, such as an IR pass filter, to implement an IR optical sensor. In another example, a related optical sensor is left uncovered by a filter and passes all wavelengths to provide a substantially white optical sensor. In yet another example, an optical sensor is overlayed by an interference filter configured to pass a select wavelength band. In another example, an optical sensor is overlayed with both interference and absorptive filters. In another example, filters are patterned in Bayer-like mosaic pattern to provide an RGB-IR sensor. In another example, an RGB-UV sensor is formed using any of the examples discussed with reference to FIG. 9 (either instead of or in addition to an RGB-IR sensor).

In an example of implementation and operation, several Fabry-Perot filters can be patterned on an image sensor, such that different optical sensors in the image sensor are paired with different Fabry-Perot passbands filters. In an example, the filters form a Bayer-like mosaic pattern on the sensor. In the example, a plurality of Fabry-Perot filters may belong to a predefined filter group, where each filter group can be formed using common mirror layers with alternative cavities. In an example, the cavity thickness of a Fabry-Perot filter in the group will determine the center wavelength of the Fabry-Perot filter. In an example, mirror layers can be implemented using reflective materials and/or Bragg stacks. In another example, a cavity may be patterned (e.g., by means of lift-off or etch processes) to alternate the thickness overlaying different optical sensors such that each filter group has several Fabry-Perot filters with different cavity thicknesses, where each of the Fabry-Perot filters is substantially matched to at least one optical sensor. In an example, several optical sensors can be adapted to collect a portion of incoming wavelengths, depending on a particular Fabry-Perot filter on the optical sensor.

In another example of implementation and operation, a plurality of filter groups of Fabry-Perot filters can be manufactured, with each filter group containing at least one Fabry-Perot filter with a predetermined cavity thickness. In an example a first filter group implements a set of 4 Fabry-Perot filters in the range of 500-600 nm when spectral transmission of the Fabry Perot filters outside of the wavelength range of 500-600 nm is undesired, for example due to Bragg mirror leakage or due to multiple harmonics of the Fabry-Perot filter. In an example, a second filter group can be configured to implement another set of 4 Fabry-Perot filters in the range of 600-700 nm when spectral transmission of the Fabry Perot filters outside of the wavelength range of 600-700 nm is undesired. In a specific example, a first group of filters is paired with one or more absorption filters configured to attenuate wavelengths outside of the passband of 500-600 nm. In the example, the absorption filter functions as a rejection filter for the first group of Fabry Perot filters. In a further example, the second group of filters is paired with an absorption filter that is adapted to attenuate wavelengths outside of the passband of 600-700 nm. In the example, one or more absorption filters can be adapted to function as a rejection filter for the second group of Fabry Perot filters. In a related example three or more groups paired with absorptive filters can be adapted to manage wavelength responses in the visible and infrared spectrum.

FIG. 10 provides a side view of an image sensor 62 with absorption filters 264A and 264B overlaying interference filter sets 242A and 242B. Referring to FIG. 6, FIG. 10 can be considered the sensor of FIG. 6 with additional layers provided in order to accommodate manufacture of a sensor system. In an example, the stopping layer 280 is deposited on the pixel layer of the sensor 62 to protect the pixel layer from subsequent lithography-based manufacturing processes. In an example, interference filter sets 242A and 242B are formed on the first stopping layer and a second stopping layer is deposited atop the interference filter sets 242A and 242B to protect interference filter sets 242A and 242B from subsequent manufacturing processes. In an example, manufacturing interference filters can result in uneven topography, due to the varying thickness associated with the different filters. Accordingly, one or more planarization layers can be provided to planarize the surface before forming absorption filters.

In an example of implementation and operation, one or more anti-reflective coatings or layers can be included between the functional elements of an image sensor. For example, stopping layer 280 can comprise an anti-reflective coating. In a specific example, the anti-reflective coating can be applied over the pixel layer of image sensor 62 and in another specific example stopping layer 280 comprises an anti-reflective coating that can function as a stopping layer for subsequent lithography steps. In another example of implementation and operation, an anti-reflective coating or layer 282 can be provisioned atop absorption filters 264A and 264B. In an example, the anti-reflective coatings can be adapted to attenuate light reflected light from an underlying structural elements, such as the pixel layer or the surface of interference filter sets 242A and 242B.

In a related example, referring to FIGS. 6 and 7, anti-reflective coatings and or materials can be added where necessary to attenuate light reflected light from any underlying structural. For example, an anti-reflective coating applied to one or more of the top surface of an absorption filter, the bottom surface of an absorption filter or on the top surface of the pixel layer of any of the sensors of FIG. 6, 7 or 10 can be included to attenuate light reflected light from an underlying structural.

FIG. 11 is a flowchart illustrating an example method for manufacturing a sensor system. The method begins at step 100, with a $1^{st}$ set of thin film layers being deposited on a semiconductor wafer substrate that has been previously manufactured to provide the optical sensors (pixels) for image sensors. In an example of implementation and operation, a manufactured substrate, such as that referred to with reference to FIG. 10 can be provided with or without a passivation layer prior to deposition of the thin film layer of a $1^{st}$ set of thin film layers. In an example, the $1^{st}$ set of thin film layers can begin with a $1^{st}$ stopping layer and/or end with a $2^{nd}$ stopping layer. The method continues at step 102, with the $1^{st}$ set of thin film layers being removed in areas not requiring the $1^{st}$ filter. The $1^{st}$ set of thin films can be removed using a lithography process followed by dry and/or wet etch processes designed to stop at a stopping layer or passivation layer.

The method continues at step 104, with a 2nd set of thin film layers being deposited on the semiconductor wafer substrate and continues at step 106, with the $2^{nd}$ set of thin film layers being removed in areas not requiring a $2^{nd}$ filter. The $2^{nd}$ set of thin film layers can be removed using a lithography process followed by dry and/or wet etch processes designed to stop at a stopping layer provided during the manufacture of the $1^{st}$ set of thin film layers. At step 108, the method repeats steps 104 to 106 as needed for additional filter layers. For example, if 6 different interference filters are called for, step 108 would include repeating steps 104 to 106 4 times.

The method continues at step 110, with a planarization layer being added. The planarization can be achieved using, for example, an oxide deposition step followed by planarization using chemical mechanical planarization (CMP). Other planarization options include the use of spin-coating (such as, for example, spin-on glass), followed by etching the topography peaks introduce during filter manufacturing, or selective etch of the topography peaks. At step 112, the method continues with the application of absorption color filter layers. In an example, the absorption color filters can be applied seriatim using spin-on pigmented resist layers followed by light exposure to cure the resist in areas requiring a filter followed by dissolving an uncured resist areas. For example, red, green and blue (RGB) filters can be applied in 3 separate lithographic processes, one each for the three different filters.

Note that in all the embodiments described, one or more absorption filters can be replaced by a plasmonic filter, with filters typically implemented using patterned metal layers to define passbands.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provide industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. An imaging device, comprises:
   a plurality of optical sensors on an integrated circuit;
   a plurality of sets of interference filters, wherein a set of interference filters of the plurality of sets of interference filters includes a plurality of interference filters that are arranged in a pattern, wherein each interference filter of the plurality of filters is configured to pass light in a different wavelength range; and
   a plurality of sets of absorption filters, wherein a set of absorption filters of the plurality of sets of absorption filters includes a plurality of absorption filters that are arranged in a pattern, wherein each absorption filter is associated with two or more interference filters to create an absorption filter and interference filter pair, wherein each absorption filter and interference filter pair is configured to pass light in a narrower wavelength range than the absorption filter alone and wherein each absorption filter and interference filter pair is associated with one or more optical sensors of the plurality of optical sensors.

2. The imaging device of claim 1, wherein the sets of interference filters are separated by an etch-stop layer from the plurality of optical sensors.

3. The imaging device of claim 1, wherein the sets of interference filters are additionally separated from the plurality of optical sensors by one of an airgap or a substantially transparent material.

4. The imaging device of claim 3, wherein the substantially transparent material comprises one or more organic materials.

5. The imaging device of claim 3, wherein the transparent material is optimized to limit reflection and/or can comprise an alloy gradient or a stack of layers.

6. The imaging device of claim 1, wherein each interference filter is selected from a group consisting of short-pass filters, long-pass filters, band-pass filters or band-stop filters, wherein each interference filter is configured to pass light in at least one of an ultraviolet spectral range, a visible light spectral range, a near infrared spectral range and an infrared spectral range.

7. The imaging device of claim 1, wherein one or more interference filters of the plurality of sets of interference filters comprises a Fabry-Pérot filter.

8. The imaging device of claim 1, wherein at least some absorption filters of the plurality of sets of absorption filters are configured to cut off light in an infrared wavelength range.

9. The imaging device of claim 1, wherein at least some absorption filters of the plurality of sets of absorption filters comprise at least one of organic filters or plasmonic filters.

10. The imaging device of claim 1, wherein the sets of absorption filters are separated by an etch-stop layer from the plurality of interference filters.

11. The imaging device of claim 1, wherein the absorption filters are additionally separated from the plurality of interference filters by one of an airgap or a substantially transparent material.

12. The imaging device of claim 1, wherein a first interference filter of a set of interference filters and a second interference filter of a set of interference filters are associated with an absorption filter of a set of absorption filters of the plurality of sets of absorption filters, wherein the first interference filter and the second interference filter are configured to provide a response including a first transmission peak and a second transmission peak respectively when combined with the absorption filter, wherein the first transmission peak is at wavelength lower than a peak response for the absorption filter and the second transmission peak is at wavelength higher than the peak response for the absorption filter.

13. The imaging device of claim 1 further comprises:
a plurality of micro-lenses disposed atop a set of absorption filters of the plurality of sets of absorption filters, wherein each micro-lens is associated with at least one absorption filter.

14. The imaging device of claim 1, wherein the plurality of optical sensors is arranged in an optical sensor array, wherein a plurality of interference filters of the plurality of sets of interference filters are associated with less than all of the plurality of optical sensors in the optical sensor array.

15. The imaging device of claim 1 further comprises:
a plurality of light baffles, wherein the plurality of light baffles are adapted to attenuate light reflecting between one or more adjacent absorption and interference pairs.

16. The imaging device of claim 1, wherein each interference filter of the plurality of sets of interference filters has a respective top surface and a respective bottom surface, wherein one or more interference filters of the plurality of interference filters includes a cavity between the top surface and the bottom surface, wherein the cavity comprises at least one of an amorphous or semi-amorphous material.

17. The imaging device of claim 1, wherein each interference filter of the plurality of sets of interference filters has a respective top surface and a respective bottom surface, wherein one or more interference filters of the plurality of interference filters includes a cavity between the top surface and the bottom surface, wherein the cavity comprises one or more materials adapted to absorb at least some undesired wavelengths while passing at least some desired wavelengths.

18. The imaging device of claim 1, wherein at least some interference filters of the plurality of sets of interference filters are configured to pass light in multiple wavelength bands.

19. A spectral imager comprises:
a plurality of optical sensors on an integrated circuit;
a plurality of sets of interference filters, wherein a set of interference filters of the plurality of sets of interference filters includes a plurality of interference filters that are arranged in a pattern, wherein each interference filter of the plurality of filters is configured to pass light in a different wavelength range; and
a plurality of sets of absorption filters, wherein a set of absorption filters of the plurality of sets of absorption filters includes a plurality of absorption filters that are arranged in a pattern, wherein each absorption filter is associated with two or more interference filters to create an absorption filter and interference filter pair, wherein each absorption filter and interference filter pair is configured to pass light in a narrower wavelength range than the absorption filter alone and wherein each absorption filter and interference filter pair is associated with one or more optical sensors of the plurality of optical sensors.

20. An image sensor, comprising:
a plurality of optical sensors on an integrated circuit;
a plurality of sets of Fabry-Pérot filters, wherein a set of Fabry-Pérot filters of the plurality of sets of Fabry-Pérot filters includes a plurality of Fabry-Pérot filters, wherein each Fabry-Pérot filter of the plurality of Fabry-Pérot filters is configured to pass light in a different wavelength range; and
a plurality of sets of absorption filters, wherein a set of absorption filters of the plurality of sets of absorption filters includes a plurality of absorption filters, wherein each absorption filter is associated with two or more Fabry-Pérot filters to create an absorption filter and Fabry-Pérot filter pair, wherein an absorption filter and Fabry-Pérot filter pair is configured to pass light in a narrower wavelength range than the absorption filter alone and wherein each absorption filter and Fabry-Pérot filter pair is associated with one or more optical sensors of the plurality of optical sensors.

* * * * *